(12) United States Patent
Kim et al.

(10) Patent No.: US 7,084,684 B2
(45) Date of Patent: Aug. 1, 2006

(54) DELAY STAGE INSENSITIVE TO OPERATING VOLTAGE AND DELAY CIRCUIT INCLUDING THE SAME

(75) Inventors: Doo-Young Kim, Seongnam-si (KR); Chi-Wook Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 31 days.

(21) Appl. No.: 10/860,947

(22) Filed: Jun. 4, 2004

(65) Prior Publication Data
US 2004/0246036 A1    Dec. 9, 2004

(30) Foreign Application Priority Data
Jun. 4, 2003    (KR) ...................... 10-2003-0035903

(51) Int. Cl.
*H03H 11/26*    (2006.01)
(52) U.S. Cl. ...................... 327/276; 327/284
(58) Field of Classification Search ...................... None
See application file for complete search history.

(56) References Cited

U.S. PATENT DOCUMENTS

| | | | |
|---|---|---|---|
| 5,410,263 A * | 4/1995 | Waizman | 327/141 |
| 5,459,424 A * | 10/1995 | Hattori | 327/278 |
| 5,767,719 A * | 6/1998 | Furuchi et al. | 327/281 |
| 5,880,612 A * | 3/1999 | Kim | 327/158 |
| 5,914,624 A * | 6/1999 | Son | 327/264 |
| 6,269,031 B1 * | 7/2001 | Fukuhara | 365/194 |
| 6,310,928 B1 * | 10/2001 | Yunome | 375/376 |
| 6,351,169 B1 * | 2/2002 | Kuge | 327/161 |
| 6,407,601 B1 * | 6/2002 | Lin | 327/158 |
| 6,452,430 B1 * | 9/2002 | Tung et al. | 327/156 |
| 6,501,307 B1 * | 12/2002 | Yen | 327/113 |
| 6,603,340 B1 * | 8/2003 | Tachimori | 327/262 |
| 6,924,685 B1 * | 8/2005 | Bae | 327/276 |

FOREIGN PATENT DOCUMENTS

| | | |
|---|---|---|
| JP | 08-102643 | 4/1996 |
| JP | 11-074783 | 3/1999 |

OTHER PUBLICATIONS

Patent Abstracts of Japan for Publication No.: 08-102643.
Patent Abstracts of Japan for Publication No.: 11-074783.

* cited by examiner

*Primary Examiner*—Timothy P. Callahan
*Assistant Examiner*—Cassandra Cox
(74) *Attorney, Agent, or Firm*—F. Chau & Associates, LLC

(57) ABSTRACT

Provided are a delay stage and a delay circuit that are insensitive to an operating voltage and have a constant delay time irrespective of a time interval between input signal pulses. The delay stage includes a first inverter that inverts an input signal, a first capacitor having one end connected to a first voltage node, a first switch that is connected between the other end of the first capacitor and an output terminal of the first inverter and is turned on in response to a control signal, a second inverter that inverts an output signal of the first inverter, a second capacitor having one end connected to a second voltage node, and a second switch that is connected between the other end of the second capacitor and an output terminal of the second inverter and is turned on in response to an inverted signal of the control signal.

24 Claims, 7 Drawing Sheets

DELAY STAGE INSENSITIVE TO OPERATING VOLTAGE AND DELAY CIRCUIT INCLUDING THE SAME

CROSS-REFERENCE TO RELATED APPLICATION

This application claims priority to Korean Patent Application No. 2003-35903, filed on Jun. 4, 2003, in the Korean Intellectual Property Office, the disclosure of which is incorporated herein by reference.

BACKGROUND

1. Technical Field

The present invention relates to a semiconductor integrated circuit, and more particularly, to a delay stage and a delay circuit.

2. Discussion of the Related Art

In semiconductor integrated circuits, a delay circuit is often used to delay a signal for a predetermined period of time for the purpose of timing control, and especially, a delay circuit, which is capable of providing a constant delay irrespective of variations in operating voltage.

In conventional semiconductor circuits, internal operating voltages are used to control delay circuits. These internal operating voltages are lower than external operating voltages and are generated by internal operating voltage generating circuits in. Such a conventional approach is difficult to be applied to recently developed semiconductor integrated circuits whose external operating voltages generally have been decreased to 1.8 volts. The level of internal operating voltages are even lower than the level of the external operating voltages.

FIG. 1 is a circuit diagram illustrating a conventional delay circuit.

The conventional delay circuit shown in FIG. 1 includes a plurality of inverting delay stages 11 through 1n connected in series. Each of the inverting delay stages 11 through 1n includes an inverter IV, a P-channel metal oxide semiconductor (PMOS) capacitor CP, an N-channel metal oxide semiconductor (NMOS) capacitor CN, a PMOS transistor PM having a gate to which a ground voltage VSS is applied, and an NMOS transistor NM having a gate to which an operating voltage VCC is applied.

In the conventional delay circuit, the NMOS transistor NM changes an effective capacitance of the NMOS capacitor CN according to the operating voltage VCC, such that the delay circuit becomes insensitive to the operating voltage VCC. However, the delay time in the conventional delay circuit varies according to the time intervals between the pulses of an input signal IN.

In particular, an A node is charged with an operating voltage VCC while the input signal IN is at a "high" level, then is quickly discharged when the input signal IN is transited from a "high" level to a "low" level, and is very slowly discharged when a voltage Vgs between a gate and a source of the PMOS transistor PM approaches a threshold voltage Vtp of the PMOS transistor PM. The A node is quickly charged with remaining charges when a subsequent input signal IN is quickly transited to a "high" level. On the other hand, when the subsequent input signal IN is slowly transited to a "high" level, that is, when the subsequent "high" transition occurs after the A node is sufficiently discharged, the A node should be charged with a large amount of charges, and accordingly the A node is slowly charged.

A B node is discharged to a ground voltage VSS while the input signal IN is at a "high" level, then is quickly charged up to an operating voltage VCC minus a threshold voltage Vtn of the NMOS transistor when the input signal IN is transited from a "high" level to a "low" level, and is slowly discharged due to a sub threshold current after that. Thus, when a subsequent input signal IN is quickly transited to a "high" level, only charges corresponding to the operating voltage VCC minus the threshold voltage Vtn are discharged to the ground voltage VSS. However, when the subsequent input signal is transited to a "high" level after the B node is sufficiently charged to the maximum operating voltage VCC level, all charges corresponding to the operating voltage VCC are discharged to the ground voltage VSS, leading to an increase in delay time.

As a consequence, the conventional delay circuit has a delay time which varies according to the time intervals between pulses of the input signal IN. A need therefore exists for a delay stage and a delay circuit that is insensitive to an operating voltage and has a constant delay time irrespective of the time intervals between input signal pulses.

SUMMARY OF THE INVENTION

According to an embodiment of the present invention, a delay stage comprises: a first inverter which inverts an input signal; a first capacitor having one end connected to an operating voltage; a first switch which is connected between the other end of the first capacitor and an output terminal of the first inverter and is turned on in response to a control signal; a second inverter which inverts an output signal of the first inverter; a second capacitor having one end connected to a ground voltage; and a second switch which is connected between the other end of the second capacitor and an output terminal of the second inverter and is turned on in response to an inverted control signal.

Preferably, the transition of the control signal occurs prior to the transition of the input signal.

According to another preferred embodiment of the invention, a delay stage comprises: a first inverter which inverts an input signal; a first capacitor having one end connected to a ground voltage; a first switch which is connected between the other end of the first capacitor and an output terminal of the first inverter and is turned on in response to a control signal; a second inverter which inverts an output signal of the first inverter; a second capacitor having one end connected to an operating voltage; and a second switch which is connected between the other end of the second capacitor and an output terminal of the second inverter and is turned on in response to an inverted control signal.

Preferably, the transition of the control signal occurs prior to the transition of the input signal.

According to another preferred embodiment, a delay stage comprises: a first inverter which inverts an input signal; a first capacitor having one end connected to an operating voltage; a first switch which is connected between the other end of the first capacitor and an output terminal of the first inverter and is turned on; a second switch which is connected between the other end of the first capacitor and a ground voltage and is turned on in response to a control signal; a second inverter which inverts an output signal of the first inverter; a second capacitor having one end connected to a ground voltage; a third switch which is connected between the other end of the second capacitor and an output terminal of the second inverter and is turned on; and a fourth switch which is connected between the other end of the second capacitor and the operating voltage and is turned on in response to an inverted signal of the control signal.

The delay stage according to this embodiment further comprises: a pulse generator which receives a delay control signal and generates the control signal of a pulse type; and an inverter which inverts the control signal and generates the inverted signal of the control signal, wherein the transition of the delay control signal occurs prior to the transition of the input signal.

According to still another preferred embodiment, the delay stage comprises: a first inverter which inverts an input signal; a first capacitor having one end connected to a ground voltage; a first switch which is connected between the other end of the first capacitor and an output terminal of the first inverter and is turned on; a second switch which is connected between the other end of the first capacitor and an operating voltage and is turned on in response to a control signal; a second inverter which inverts an output signal of the first inverter; a second capacitor having one end connected to an operating voltage; a third switch which is connected between the other end of the second capacitor and an output terminal of the second inverter and is turned on; and a fourth switch which is connected between the other end of the second capacitor and a ground voltage and is turned on in response to an inverted signal of the control signal.

The delay stage according to this embodiment may further comprise: a pulse generator which receives a delay control signal and generates the control signal of a pulse type; and an inverter which inverts the control signal and generates the inverted signal of the control signal, wherein the transition of the delay control signal occurs prior to the transition of the input signal.

According to yet another preferred embodiment, a delay circuit comprises: a plurality of delay stages connected in series, each of the delay stages comprising: a first inverter which inverts an input signal; a first capacitor having one end connected to an operating voltage; a first switch which is connected between the other end of the first capacitor and an output terminal of the first inverter and is turned on in response to a control signal; a second inverter which inverts an output signal of the first inverter; a second capacitor having one end connected to a ground voltage; and a second switch which is connected between the other end of the second capacitor and an output terminal of the second inverter and is turned on in response to an inverted signal of the control signal.

Preferably, the transition of the control signal occurs prior to the transition of the input signal.

According to another preferred embodiment, a delay circuit comprises: a plurality of delay stages connected in series, each of the delay stages comprising: a first inverter which inverts an input signal; a first capacitor having one end connected to a ground voltage; a first switch which is connected between the other end of the first capacitor and an output terminal of the first inverter and is turned on in response to a control signal; a second inverter which inverts an output signal of the first inverter; a second capacitor having one end connected to an operating voltage; and a second switch which is connected between the other end of the second capacitor and an output terminal of the second inverter and is turned on in response to an inverted signal of the control signal.

Preferably, the transition of the control signal occurs prior to the transition of the input signal.

According to yet another embodiment, a delay circuit comprises: a plurality of delay stages connected in series, each of the delay stages comprising: a first inverter which inverts an input signal; a first capacitor having one end connected to an operating voltage; a first switch which is connected between the other end of the first capacitor and an output terminal of the first inverter and is turned on; a second switch which is connected between the other end of the first capacitor and a ground voltage and is turned on in response to a control signal; a second inverter which inverts an output signal of the first inverter; a second capacitor having one end connected to the ground voltage; a third switch which is connected between the other end of the second capacitor and an output terminal of the second inverter and is turned on; and a fourth switch which is connected between the other end of the second capacitor and the operating voltage and is turned on in response to an inverted signal of the control signal.

The delay circuit according to this embodiment may further comprise: a pulse generator which receives a delay control signal and generates the control signal of a pulse type; and an inverter which inverts the control signal and generates the inverted signal of the control signal, wherein the transition of the delay control signal occurs prior to the transition of the input signal.

According to still another preferred embodiment, the delay circuit comprises: a plurality of delay stages connected in series, each of the delay stages comprising: a first inverter which inverts an input signal; a first capacitor having one end connected to a ground voltage; a first switch which is connected between the other end of the first capacitor and an output terminal of the first inverter and is turned on; a second switch which is connected between the other end of the first capacitor and an operating voltage and is turned on in response to a control signal; a second inverter which inverts an output signal of the first inverter; a second capacitor having one end connected to the operating voltage; a third switch which is connected between the other end of the second capacitor and an output terminal of the second inverter and is turned on; and a fourth switch which is connected between the other end of the second capacitor and the ground voltage and is turned on in response to an inverted signal of the control signal.

The delay circuit according to this embodiment may further comprise: a pulse generator which receives a delay control signal and generates the control signal of a pulse type; and an inverter which inverts the control signal and generates the inverted signal of the control signal, wherein the transition of the delay control signal occurs prior to the transition of the input signal.

BRIEF DESCRIPTION OF THE DRAWINGS

The above features of the present invention will become more apparent by describing in detail exemplary embodiments thereof with reference to the attached drawings in which.

DETAILED DESCRIPTION OF PREFERRED EMBODIMENTS

The embodiments of the present invention will now be described in further detail with reference to the accompanying drawings.

Figure 1:
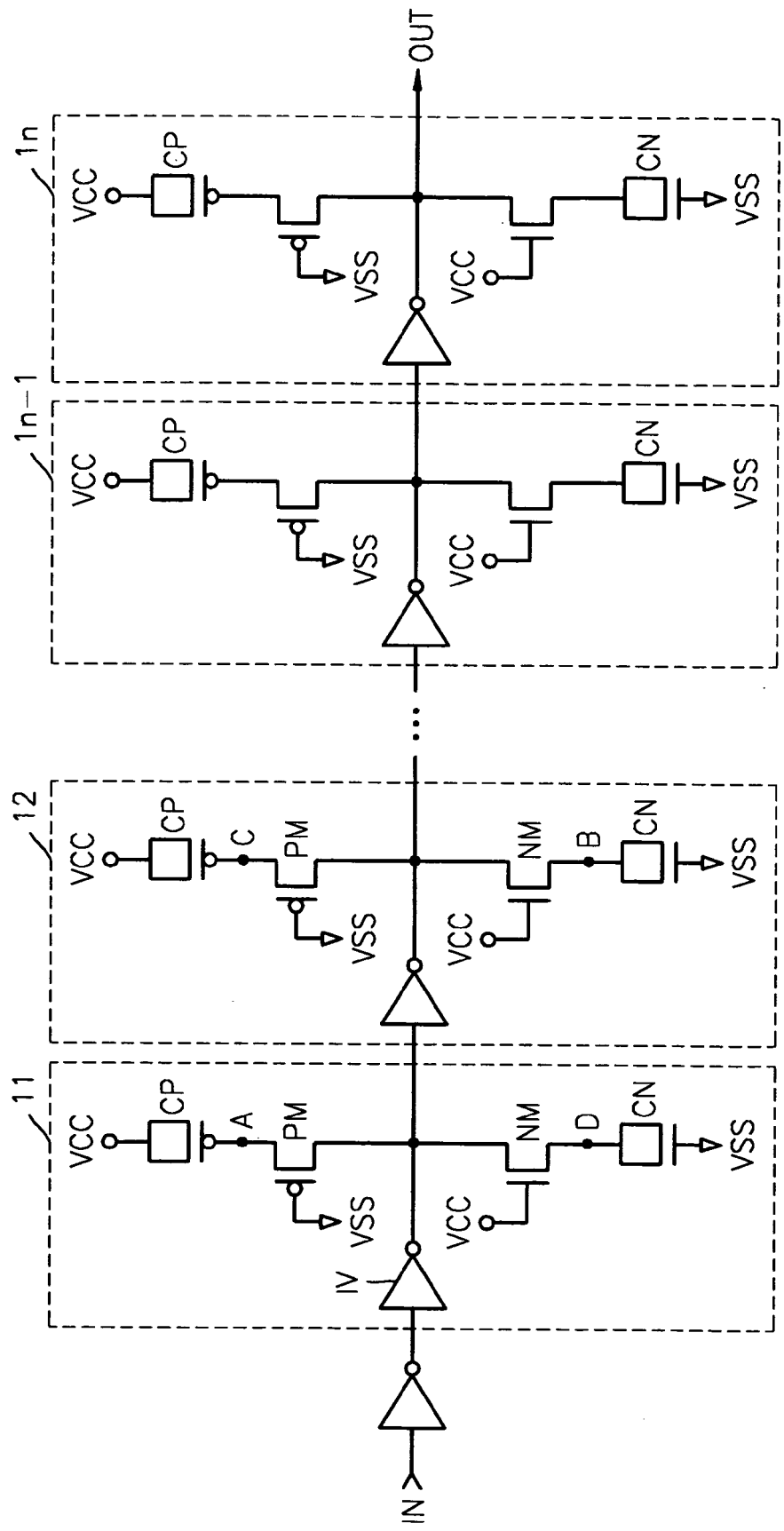
FIG. 1 is a circuit diagram of a conventional delay circuit.
Figure 2:
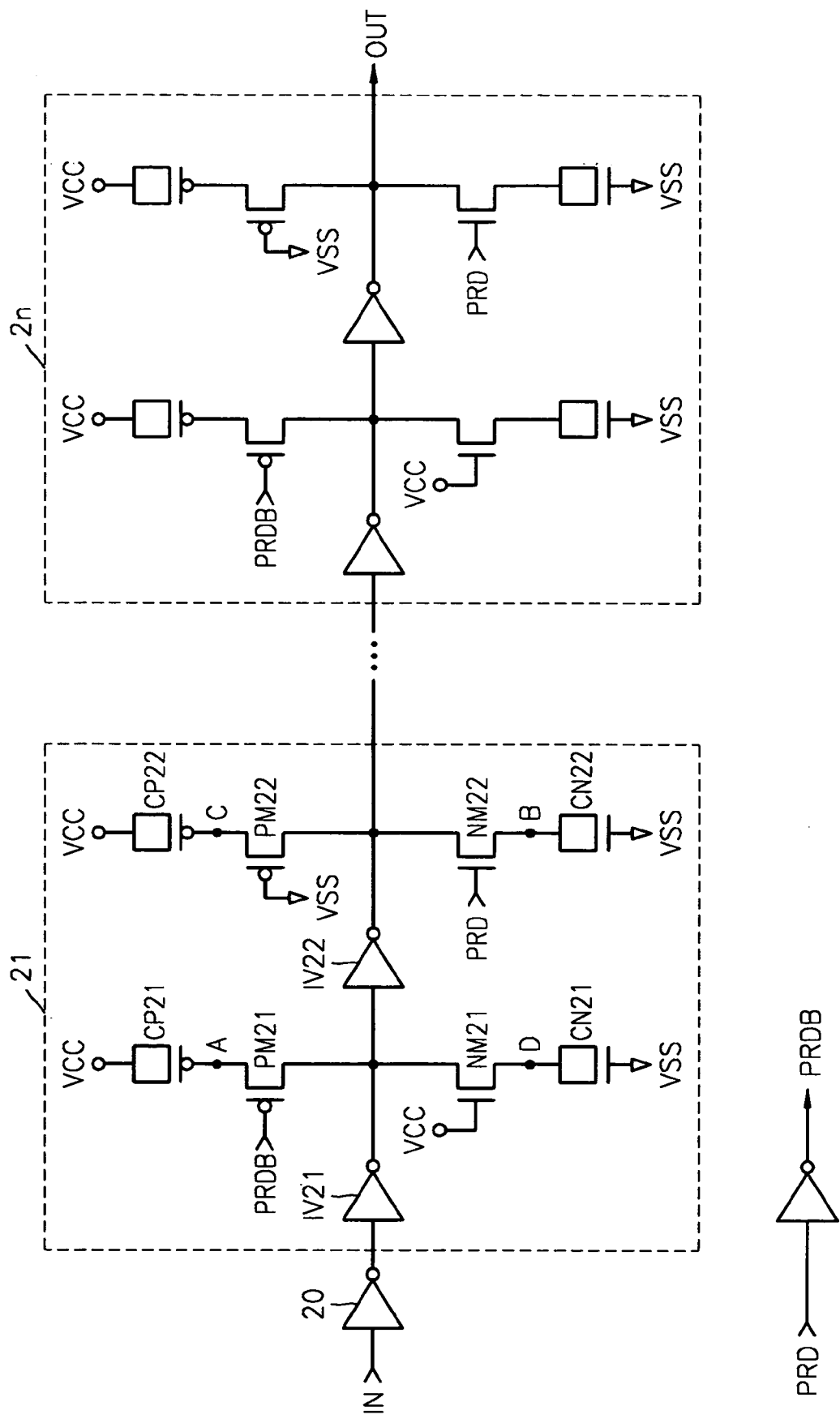
FIG. 2 is a circuit diagram of a delay circuit according to a preferred embodiment of the present invention.
Figure 3:
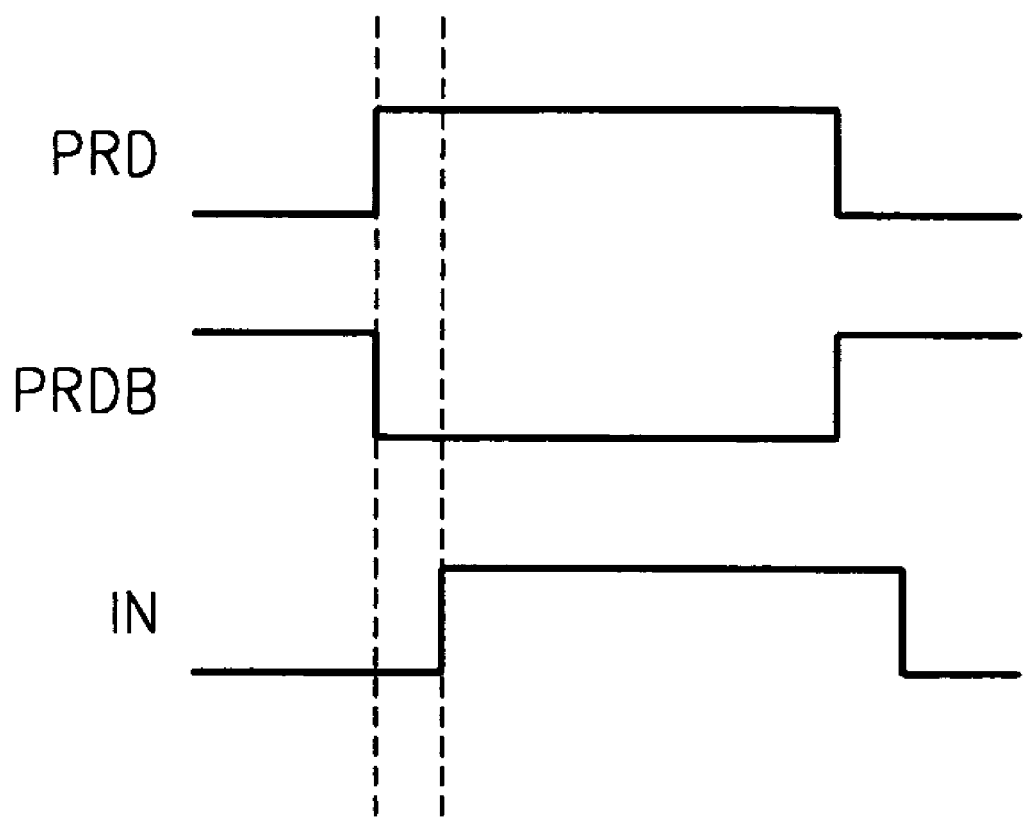
FIG. 3 is a timing diagram of an input signal IN and a control signal PRD shown in FIG. 2.

FIG. 2 is a circuit diagram of a delay circuit according to a preferred embodiment of the present invention. FIG. 3 is a timing diagram of an input signal IN and a control signal PRD shown in FIG. 2. The delay circuit according to this preferred embodiment has a constant delay time irrespective of the time interval between a "low" transition and a "high" transition of the input signal IN.

Referring to FIG. 2, the delay circuit includes a plurality of delay stages 21 through 2n connected in series. Each of the delay stages 21 through 2n includes two inverters IV21 and IV22, two P-channel metal oxide semiconductor (PMOS) capacitors CP21 and CP22, two PMOS transistors PM21 and PM22, two N-channel metal oxide semiconductor (NMOS) capacitors CN21 and CN22, and two NMOS transistors NM21 and NM22.

An inverter 20 inverts an input signal IN. The inverter IV21 inverts the inverted signal of the input signal IN. The inverter IV22 inverts an output signal of the inverter IV21. The PMOS capacitor CP21 has one end connected to an operating voltage VCC. The PMOS transistor PM21 functions as a switch connected between the other end of the PMOS capacitor CP21 and an output terminal of the inverter IV21, and is turned on in response to an inverted control signal PRDB.

The NMOS capacitor CN21 has one end connected to a ground voltage VSS. The NMOS transistor NM21 is connected between the other end of the NMOS capacitor CN21 and the output terminal of the inverter IV21, and has a gate to which the operating voltage VCC is connected. Accordingly, the NMOS transistor NM21 is turned on.

The PMOS capacitor CP22 has one end connected to the operating voltage VCC. The PMOS transistor PM22 is connected between the other end of the PMOS capacitor CP22 and an output terminal of the inverter IV22, and has a gate to which the ground voltage VSS is connected. Accordingly, the PMOS transistor PM22 is turned on.

The NMOS capacitor CN22 has one end connected to the ground voltage VSS. The NMOS transistor NM22 functions as a switch connected between the other end of the NMOS capacitor CN22 and the output terminal of the inverter IV22, which inverts the control signal PRD into an inverted control signal PRDB. The NMOS transistor NM22 is turned on in response to the control signal PRD.

In particular, the control signal PRD and the inverted signal PRDB of the control signal PRD has a transition time prior to the transition time of the input signal IN as shown in the timing diagram of FIG. 3.

It should be noted that the NMOS capacitor CN21 and the NMOS transistor NM21 can be excluded within the delay stages 21 through 2n, if necessary. Alternatively, the PMOS capacitor CP22 and the PMOS transistor PM22 can be excluded within the delay stages 21 through 2n, if necessary. Or, the NMOS capacitor CN21, the NMOS transistor NM21, the PMOS capacitor CP22, and the PMOS transistor PM22 can be excluded collectively within the delay stages 21 through 2n, if necessary.

Operation of the delay circuit according to this preferred embodiment of the present invention will be explained in further detail. In the delay circuit, the PMOS transistor PM21 and the NMOS transistor NM22 are turned on before the input signal IN is transited from a "low" level to a "high" level, and the PMOS transistor PM21 and the NMOS transistor NM22 are turned off before the input signal IN is transited from a "high" level to a "low" level, under the control of the control signal PRD and the complementary signal PRDB of the control signal PRD that have a transition time prior to the transition time of the input signal IN. Accordingly, a difference in a voltage level of a pertinent node according to a time interval between a current transition and a subsequent transition is minimized.

In more detail, the PMOS transistor PM21 is turned on by the control signal PRDB of a "low" level before the input signal IN is transited from a "low" level to a "high" level, such that an A node is electrically connected to the output terminal of the inverter IV21. The A node is charged with the operating voltage VCC after the input signal IN is transited from a "low" level to a "high" level, and the PMOS transistor PM21 is turned off by the control signal PRDB of a "high" level when the input signal IN is transited from a "high" level to a "low" level, such that the charged state of the A node is maintained for a long time.

When a "high" transition of the control signal PRDB happens later than a "low" transition of the input signal IN, the voltage of the A node is maintained at the operating voltage VCC minus a threshold voltage Vtp of the PMOS transistor. When a "low" transition of the control signal PRDB happens earlier than the "low" transition of the input signal IN, the voltage of the A node is maintained at the operating voltage VCC. When the "high" transition of the control signal PRDB happens earlier than the "low" transition of the input signal IN, the voltage of the A node decreases in time from the operating voltage VCC due to leakage of current of the PMOS transistor PM21. However, since the PMOS transistor PM21 is completely turned off, a very long time has to pass until the voltage of the A node is completely discharged to the ground voltage VSS.

In the case of a dynamic random access memory (DRAM), if the voltage of the A node is over the threshold voltage Vtp of the PMOS transistor PM21 for a duration as long as a refresh cycle of the DRAM, the PMOS transistor PM21 is turned on by the control signal PRDB, such that the A node is discharged to a level of the threshold voltage of the PMOS transistor PM21 irrespective of an interval between a "low" transition and a "high" transition of the input signal IN.

Since the NMOS transistor NM22 is turned on by the control signal PRD of a "high" level before the input signal IN is transited from a "low" level to a "high" level, a B node is electrically connected to the output terminal of the inverter IV22. After the input signal 1N is transited from a "low" level to a "high" level, the B node is charged with the ground voltage VSS. When the input signal IN is transited from a "high" level to a "low" level, the NMOS transistor NM22 is turned off by the control signal PRD of a "low" level, such that the discharged state of the B node is maintained for a long time.

When a "low" transition of the control signal PRD is later than a "low" transition of the input signal IN, the voltage of the B node is maintained at the operating voltage VCC minus the threshold voltage Vtn of the NMOS transistor. When the "high" transition of the control signal PRD happens earlier than the "low" transition of the input signal IN, the voltage of the B node is maintained at the ground voltage VSS. When the "low" transition of the control signal PRD happens earlier than the "low" transition of the input signal IN, the voltage of the B node increases in time from the ground voltage VSS due to a leakage of current of the NMOS transistor NM22. However, since the NMOS transistor NM22 is completely turned off, a very long time has to pass until the B node is completely charged with the operating voltage VCC.

In case of a DRAM, if the voltage of the B node is below the operating voltage VCC minus the threshold voltage Vtn of the NMOS transistor for a duration as long as a refresh cycle, the NMOS transistor NM22 is turned on by the control signal PRD, such that the voltage of the B node is set to a level of the operating voltage VCC minus the threshold voltage Vtn of the NMOS transistor irrespective of an interval between a "low" transition and a "high" transition of the input signal IN, and thus the input signal IN is transited to a "high" level.

As described above, the delay circuit according to this preferred embodiment of the present invention is insensitive to an operating voltage and has a constant delay time irrespective of a time interval between a "low" transition and a "high" transition of the input signal IN. Furthermore, the circuit has the same effect on a time interval between a "high" transition and a "low" transition of the input signal IN.

Figure 4:
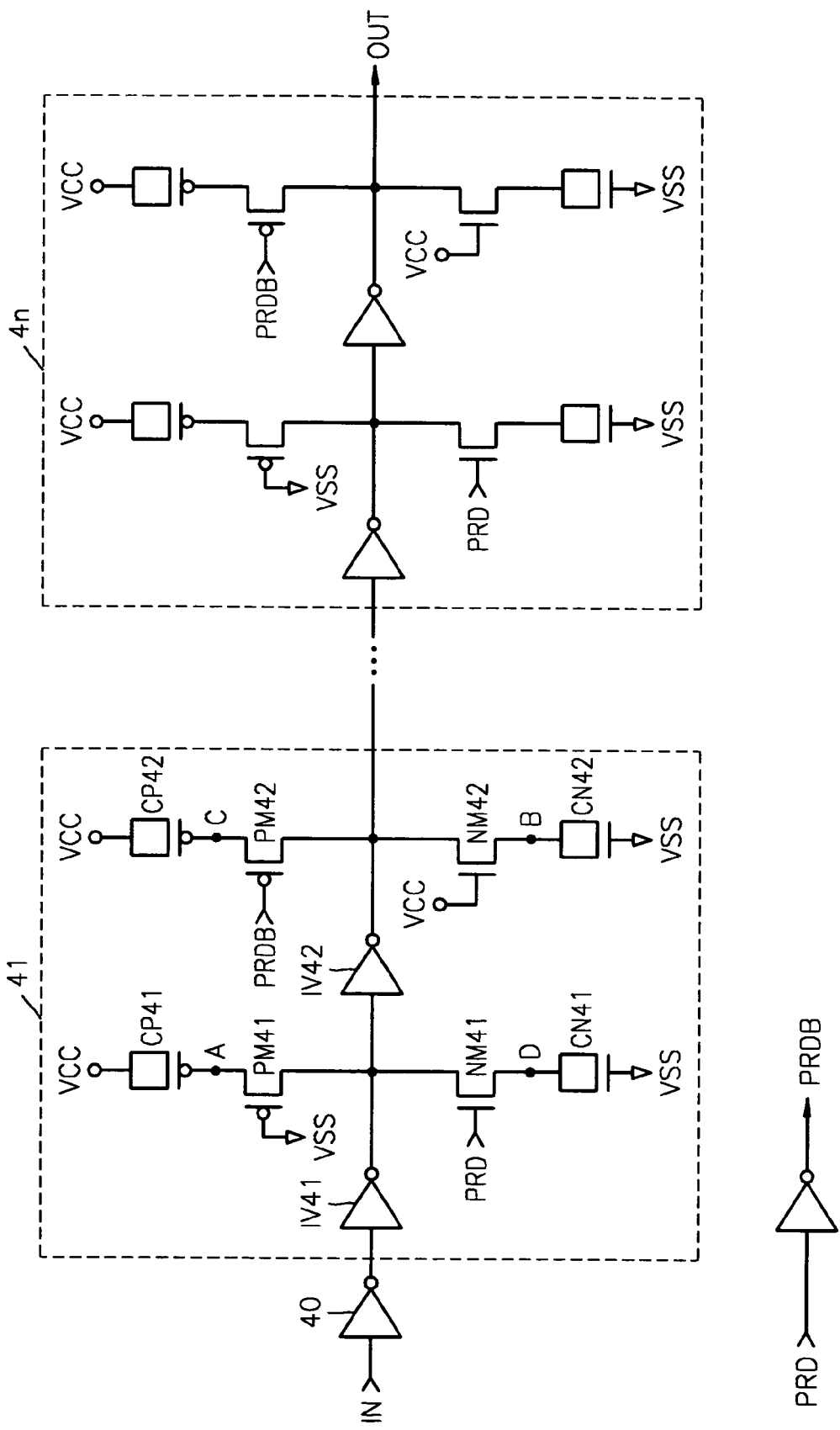
FIG. 4 is a circuit diagram of a delay circuit according to another preferred embodiment of the present invention.

FIG. 4 is a delay circuit according to another preferred embodiment of the present invention. The delay circuit has a constant delay time irrespective of a time interval between a "high" transition and a "low" transition of an input signal IN.

Referring to FIG. 4, the delay circuit includes a plurality of delay stages 41 through 4n connected in series. Each of the delay stages 41 through 4n includes two inverters IV41 and IV42, two PMOS capacitors CP41 and CP42, two PMOS transistors PM41 and PM42, two NMOS capacitors CN41 and CN42, and two NMOS transistors NM41 and NM42.

An inverter 40 inverts an input signal IN. The inverter IV41 inverts the inverted signal of the input signal IN. The inverter IV42 inverts an output signal of the inverter IV41. The PMOS capacitor CP41 has one end connected to an operating voltage VCC. The PMOS transistor PM41 is connected between the other end of the PMOS capacitor CP41 and an output terminal of the inverter IV41, and has a gate to which a ground voltage VSS is connected. Accordingly, the PMOS transistor PM41 is turned on.

The NMOS capacitor CN41 has one end connected to the ground voltage VSS. The NMOS transistor NM41 functions as a switch connected between the other end of the NMOS capacitor CN41 and the output terminal of the inverter IV41, and is turned on in response to a control signal PRD.

The PMOS capacitor CP42 has one end connected to the operating voltage VCC. The PMOS transistor PM42 is connected between the other end of the PMOS capacitor CP42 and an output terminal of the inverter IV42, and is turned on in response to an inverted signal PRDB of the control signal PRD.

The NMOS capacitor CN42 has one end connected to the ground voltage VSS. The NMOS transistor NM42 is connected between the other end of the NMOS capacitor CN42 and the output terminal of the inverter IV42, and has a gate connected to the operating voltage VCC. Accordingly, the NMOS transistor NM42 is turned on.

In particular, the control signals PRD and the inverted control signal PRDB of the control signal PRD have a transition time earlier than the transition time of the input signal IN, similarly to the previously discussed embodiment. It should be noted that the PMOS capacitor CP41 and the PMOS transistor PM41 can be excluded within the delay stages 41 through 4n, if necessary. Alternatively, the NMOS capacitor CN42 and the NMOS transistor NM42 can be excluded within the delay stages 41 through 4n, if necessary. Or, the PMOS capacitor CP41, the PMOS transistor PM41, the NMOS capacitor CN42, and the NMOS transistor NM42 can be excluded collectively within the delay stages 41 through 4n, if necessary.

Operation of the delay circuit according to this preferred embodiment of the present invention is similar to the operation of the delay circuit according to the previous preferred embodiment of the present invention, and therefore will not be explained in detail.

Figure 5:
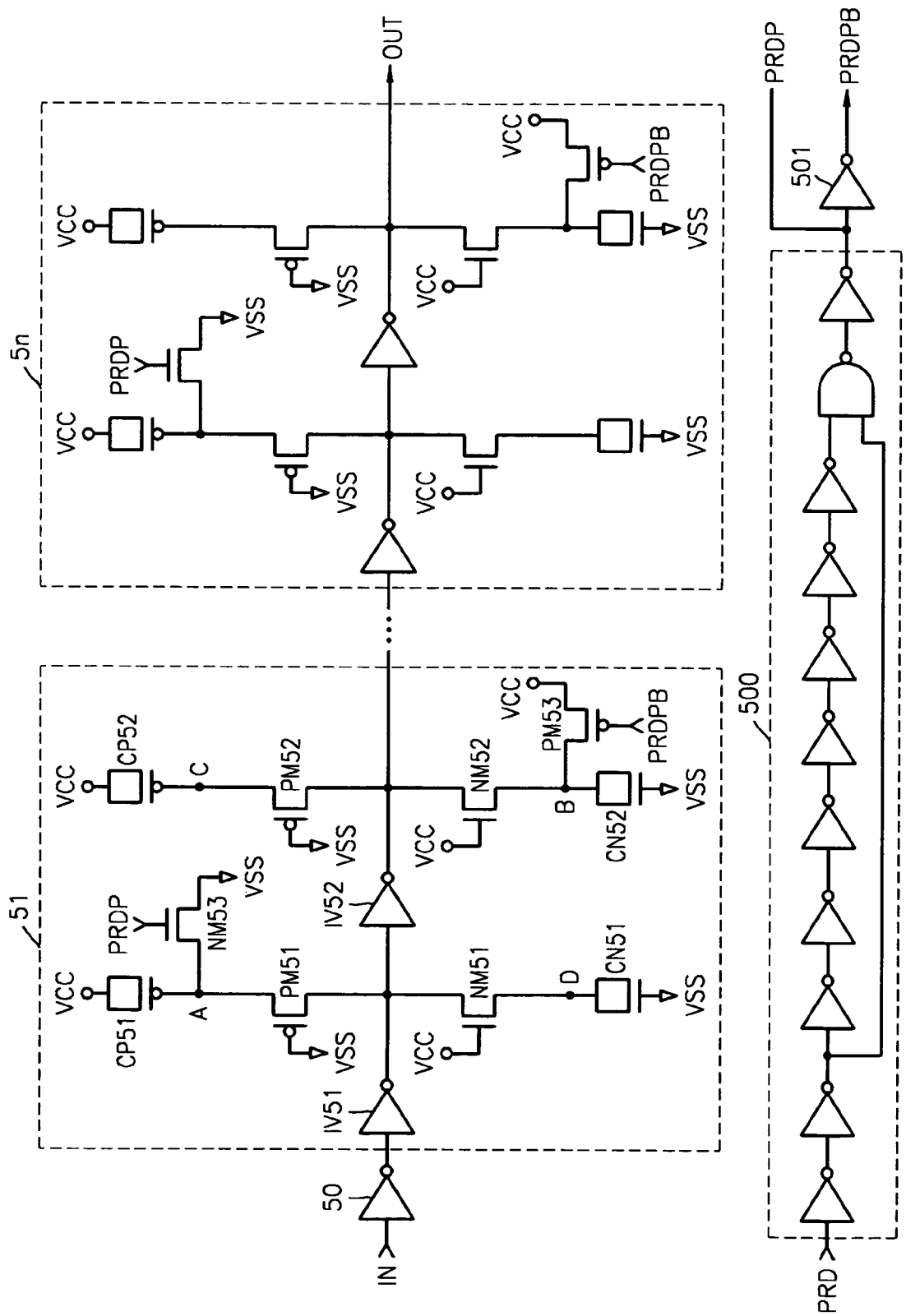
FIG. 5 is a circuit diagram of a delay circuit according to another preferred embodiment of the present invention.
Figure 6:
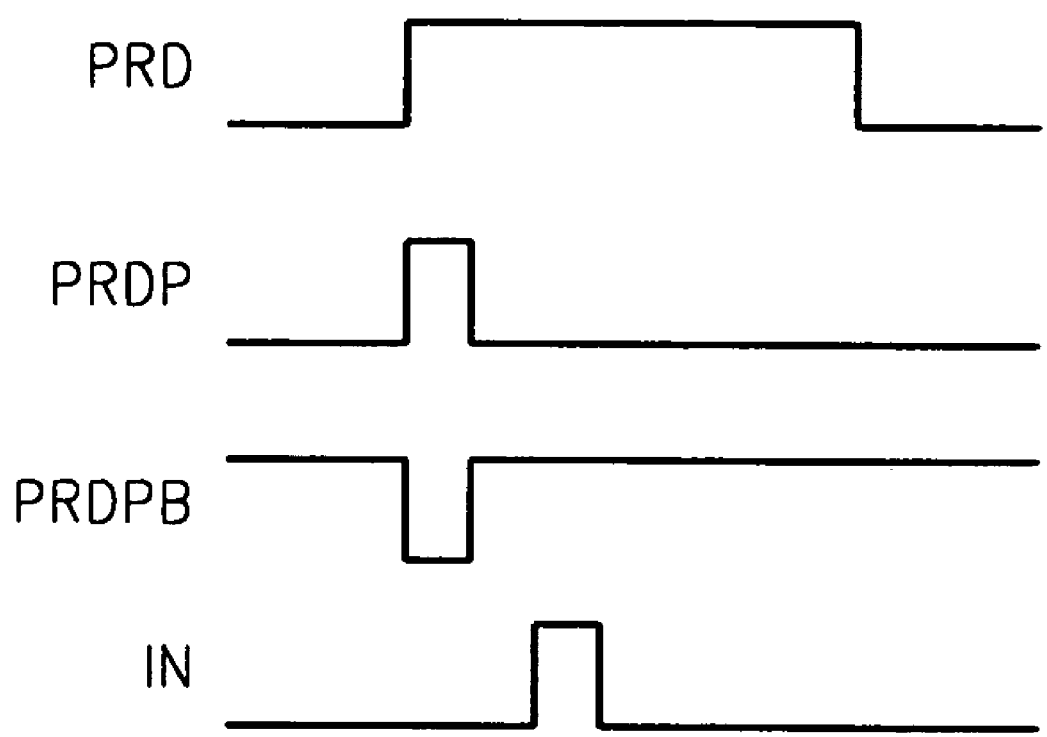
FIG. 6 is a timing diagram of an input signal IN and control signals PRD and PRDP shown in FIG. 5.

FIG. 5 is a circuit diagram of a delay circuit according to still another preferred embodiment of the present invention. FIG. 6 is a timing diagram of an input signal IN and control signals PRD and PRDP shown in FIG. 5. The delay circuit according to this preferred embodiment has a constant delay time irrespective of a time interval between a "low" transition and a "high" transition of the input signal IN.

Referring to FIG. 5, the delay circuit includes a plurality of delay stages 51 through 5n and a pulse generator 500. Each of the delay stages 51 through 5n includes two inverters IV51 and IV52, two PMOS capacitors CP51 and CP52, three PMOS transistors PM51, PM52, and PM53, two NMOS capacitors CN51 and CN52, and three NMOS transistors NM51, NM52, and NM53.

An inverter 50 inverts an input signal IN. The inverter IV51 inverts the inverted signal of the input signal IN. The inverter IV52 inverts an output signal of the inverter IV51. The PMOS capacitor CP51 has one end connected to an operating voltage VCC. The PMOS transistor PM51 is connected between the other end of the PMOS capacitor CP51 and an output terminal of the inverter IV51, and has a gate to which a ground voltage VSS is connected. Accordingly, the PMOS transistor PM51 is turned on. The NMOS transistor NM53 is connected between the other end of the PMOS capacitor CP51 and a ground voltage VSS, and is turned on in response to a control signal PRDP.

The NMOS capacitor CN51 has one end connected to the ground voltage VSS. The NMOS transistor NM51 is connected between the other end of the NMOS transistor NM51 and the output terminal of the inverter IV51, and has a gate to which the operating voltage VCC is connected. Accordingly, the NMOS transistor NM51 is turned on.

The PMOS capacitor CP52 has one end connected to the operating voltage VCC. The PMOS transistor PM52 is connected between the other end of the PMOS capacitor CP52 and an output terminal of the inverter IV52, and has a gate to which the ground voltage VSS is connected. Accordingly, the PMOS transistor PM52 is turned on.

The NMOS capacitor CN52 has one end connected to the ground voltage VSS. The NMOS transistor NM52 is connected between the other end of the NMOS capacitor CN52 and the output terminal of the inverter IV52, and has a gate to which the operating voltage VCC is connected. Accordingly, the NMOS transistor NM52 is turned on. The PMOS transistor PM53 is connected between the other end of the NMOS capacitor CN52 and an operating voltage VCC, and is turned on in response to an inverted signal PRDPB of the control signal PRDP.

The pulse generator 500 receives a delay control signal PRD and generates the control signal PRDP having such a pulse type as shown in FIG. 6. An inverter 501 receives the control signal PRDP and generates the inverted signal PRDPB of the control signal PRDP. In particular, the delay control signal PRD, the inverted delay control signal PRDPB and PRDP have a transition time prior to the transition time of the input signal IN.

It should also be noted that the PMOS capacitor CP52 and the PMOS transistor PM52 can be excluded within the delay stages 51 and 5n, if necessary. Alternatively, the NMOS capacitor CN51 and the NMOS transistor NM51 can be excluded within the delay stages 51 through 5N, if necessary. Or, the PMOS capacitor CP52, the PMOS transistor PM52, the NMOS capacitor CN51, and the NMOS transistor NM51 can be excluded within the delay stages 51 through 5n, if necessary.

It can be seen that the delay circuit according to this preferred embodiment is capable of setting an A node to a ground voltage VSS and setting a B node to an operating voltage VCC before a transition of the input signal IN, such that the delay circuit is unaffected by any current leakage.

A means for setting the A node to the ground voltage VSS before the transition of the input signal IN includes the NMOS transistor NM53 and the control signal PRDP of a pulse type applied to a gate of the NMOS transistor NM53. A means for setting the B node to the operating voltage VCC before the transition of the input signal IN includes the PMOS transistor PM53 and the inverted control signal PRDPB applied to a gate of the PMOS transistor PM53.

Operation of the delay circuit according to this preferred embodiment of the present invention is similar to the operation of the delay circuit according to the previously mentioned preferred embodiments of the present invention, and therefore will not be explained in detail.

Figure 7:
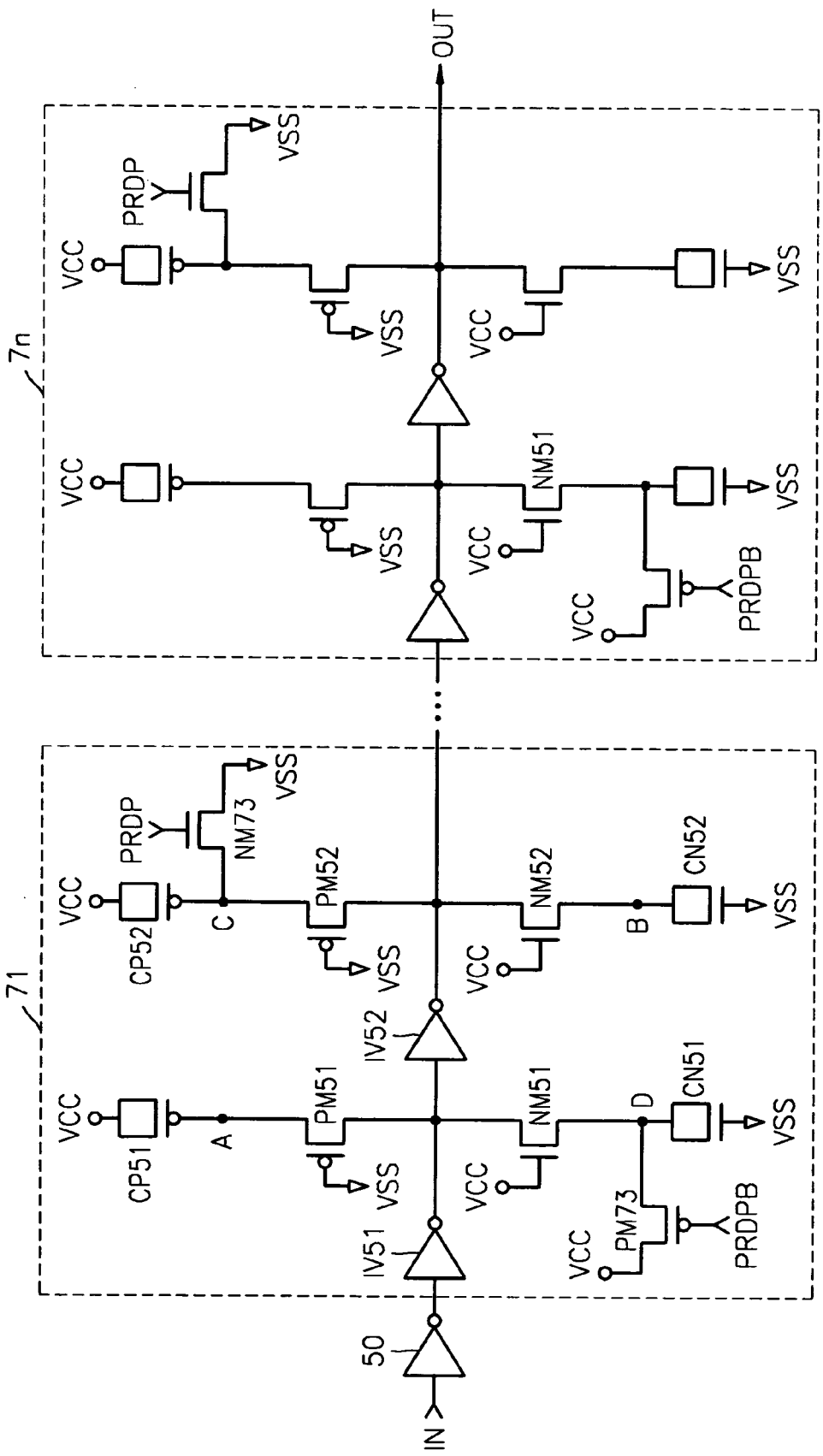
FIG. 7 is a circuit diagram of a delay circuit according to still another preferred embodiment of the present invention.

FIG. 7 is a circuit diagram of a delay circuit according to still another preferred embodiment of the present invention. The delay circuit has a constant delay time irrespective of a time interval between a "high" transition and a "low" transition of an input signal IN.

Referring to FIG. 7, the delay circuit includes a plurality of delay stages 71 through 7n connected in series and a pulse generator 500 as shown in FIG. 5. Each of the plurality of delay stages 71 through 7n includes two inverters IV51 and IV52, two PMOS capacitors CP51 and CP52, three PMOS transistors PM51, PM52, and PM73, two NMOS capacitors CN51 and CN52, and three NMOS transistors NM51, NM52, and NM73.

The same reference numerals indicate the same elements throughout FIGS. 5 and 7. The NMOS transistor NM73 is connected between one end of the PMOS capacitor CP52 and a ground voltage VSS, and is turned on in response to a pulse control signal PRDP. The PMOS transistor PM73 is connected between one end of the NMOS capacitor CN51 and an operating voltage VCC, and is turned on in response to an inverted control signal PRDPB. The control signal PRDP and the inverted control signal PRDPB are the same as those described in this preferred embodiment of FIG. 5.

Further, the PMOS capacitor CP51 and the PMOS transistor PM51 can be excluded within the delay stages 71 through 7n, if necessary. Alternatively, the NMOS capacitor CN52 and the NMOS transistor NM52 can be excluded within the delay stages 71 through 7n, if necessary. Or, the PMOS capacitor CP51, the PMOS transistor PM51, the NMOS capacitor CN52, and the NMOS transistor NM52 can also be excluded collectively within the delay stages 71 through 7n, if necessary.

The delay circuit according to this preferred embodiment is capable of setting a C node to a ground voltage VSS before a transition of the input signal IN and setting a D node to an operating voltage VCC before a transition of the input signal IN, such that the delay circuit is unaffected by any current leakage.

Here, the means for setting the C node to the ground voltage VSS before the transition of the input signal IN are the NMOS transistor NM73 and the pulse control signal PRDP applied to the gate of the NMOS transistor NM73. The means for setting the D node to the operating voltage VCC before the transition of the input signal IN are the PMOS transistor PM73 and the inverted signal PRDPB of the control signal PRDP applied to the gate of the PMOS transistor PM73.

Operation of the delay circuit according to this preferred embodiment is similar to the operation of the delay circuit according to the previously mentioned preferred embodiment, and therefore will not be explained in detail.

As described above, the delay stage and the delay circuit according to the embodiments of the present invention do not vary in delay when there are variations in an operating voltage level and provide a constant delay irrespective of the time intervals between input signal pulses.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A delay stage comprising:
   a first inverter that inverts an input signal;
   a first capacitor having one end connected to a first voltage node;
   a first switch that is connected between the other end of the first capacitor and an output terminal of the first inverter and is turned on in response to a control signal;
   a second inverter that inverts an output signal of the first inverter;
   a second capacitor having one end connected to a second voltage node; and
   a second switch that is connected between the other end of the second capacitor and an output terminal of the second inverter and is turned on in response to an inverted signal of the control signal, wherein the transition of the control signal occurs prior to the transition of the input signal.

2. The delay stage of claim 1, further comprising:
   a third capacitor having one end connected to the second voltage node; and
   a third switch that is connected between the other end of the third capacitor and the output terminal of the first inverter and is turned on.

3. The delay stage of claim 1, further comprising:
   a third capacitor having one end connected to the first voltage node; and
   a third switch that is connected between the other end of the third capacitor and the output terminal of the second inverter.

4. The delay stage according to claim 1, wherein the first voltage node having an operating voltage; and
   the second voltage node having a ground voltage.

5. The delay stage according to claim 1, wherein the first voltage node having a ground voltage; and
   the second voltage node having an operating voltage.

6. A delay stage comprising:
   a first inverter that inverts an input signal;
   a first capacitor connected to a first voltage node;
   a first switch, which is connected between the other end of the first capacitor and an output terminal of the first inverter and is turned on;

a second switch that is connected between the other end of the first capacitor and a second voltage node and is turned on in response to a control signal;

a second inverter that inverts an output signal of the first inverter;

a second capacitor connected to the second voltage node;

a third switch that is connected between the other end of the second capacitor and an output terminal of the second inverter and is turned on; and a fourth switch that is connected between the other end of the second capacitor and the first voltage node and is turned on in response to an inverted signal of the control signal.

7. The delay stage of claim 6, further comprising:

a pulse generator that receives a delay control signal and generates the control signal of a pulse type; and an inverter that inverts the control signal and generates the inverted signal of the control signal, wherein the delay control signal has a transition time prior to the transition time of the input signal.

8. The delay stage of claim 7, further comprising:

a third capacitor having one end connected to the second voltage node; and a fifth switch that is connected between the other end of the third capacitor and the output terminal of the first inverter and is turned on.

9. The delay stage of claim 7, further comprising:

a third capacitor having one end connected to the first voltage node; and a fifth switch that is connected between the other end of the third capacitor and the output terminal of the second inverter and is turned on.

10. The delay stage of claim 6, wherein the first voltage node having an operating voltage; and the second voltage node having a ground voltage.

11. The delay stage according to claim 6, wherein the first voltage node having a ground voltage; and the second voltage node having an operating voltage.

12. A delay circuit comprising one or more of the delay stages of claim 1 connected in series.

13. The delay circuit of claim 12, wherein the transition of the control signal occurs prior to the transition of the input signal.

14. The delay circuit of claim 12, wherein each of the delay stages further includes:

a third capacitor having one end connected to the second voltage node; and a third switch that is connected between the other end of the third capacitor and the output terminal of the first inverter and is turned on.

15. The delay circuit of claim 12, wherein each of the delay stages further includes:

a third capacitor having one end connected to the first voltage node; and a third switch that is connected between the other end of the third capacitor and the output terminal of the second inverter and is turned on.

16. The delay circuit of claim 12, wherein the first voltage node having an operating voltage; and the second voltage node having a ground voltage.

17. The delay circuit according to claim 12, wherein:

the first voltage node having a ground voltage; and the second voltage node having an operating voltage.

18. A delay circuit comprising one or more of the delay stages of claim 6 connected in series.

19. The delay circuit of claim 18, further comprising:

a pulse generator that receives a delay control signal and generates the control signal of a pulse type; and an inverter that inverts the control signal and generates the inverted signal of the control signal, wherein the delay control signal has a transition time prior to the transition time of the input signal.

20. The delay circuit of claim 18, wherein each of the delay stages further includes:

a third capacitor having one end connected to the second voltage node; and a fifth switch that is connected between the other end of the third capacitor and the output terminal of the first inverter and is turned on.

21. The delay circuit of claim 18, wherein each of the delay stages further includes:

a third capacitor having one end connected to the first voltage node; and a fifth switch that is connected between the other end of the third capacitor and the output terminal of the second inverter and is turned on.

22. The delay circuit according to claim 18, wherein the first voltage node having a ground voltage; and the second voltage node having an operating voltage.

23. The delay circuit according to claim 18, wherein the first voltage node having an operating voltage; and the second voltage node having a ground voltage.

24. A method for maintaining a voltage level of a node during an interval between a current transition and a subsequent transition of an input signal, comprising:

inputting an input signal to a delay stage;

inputting a control signal to the delay stage, wherein the transition of the control signal occurs prior to a transition of the input signal;

pre-charging at least one of the nodes to a first or a second voltage level before the transition of the input signal;

maintaining the charged state of at least one of the nodes at the first or the second voltage level during the transition of the input signal.

* * * * *